United States Patent [19]
Singh et al.

[11] Patent Number: 5,977,542
[45] Date of Patent: Nov. 2, 1999

[54] RESTORATION OF CD FIDELITY BY DISSIPATING ELECTROSTATIC CHARGE

[76] Inventors: Bhanwar Singh, 17122 Heatherwood Way, Morgan Hill, Calif. 95037; Subash Gupta, 18887 McFarland Ave., Saratoga, Calif. 95070; Bryan Choo, 234 Escuela Ave., #74, Mountain View, Calif. 94040

[21] Appl. No.: 08/927,971

[22] Filed: Sep. 11, 1997

[51] Int. Cl.⁶ .............................. H05H 3/00; H01J 37/38
[52] U.S. Cl. ........................ 250/307; 250/251; 250/310
[58] Field of Search .................................. 250/307, 310, 250/311, 251

[56] References Cited

U.S. PATENT DOCUMENTS

| | | | |
|---|---|---|---|
| 4,125,440 | 11/1978 | Markovits | 204/1 T |
| 4,259,003 | 3/1981 | Mangal et al. | 355/3 |
| 4,265,998 | 5/1981 | Barkley | 430/125 |
| 5,032,422 | 7/1991 | Lalmirand et al. | 427/33 |
| 5,049,404 | 9/1991 | Kisler et al. | 427/30 |
| 5,171,709 | 12/1992 | Donelon et al. | 250/492.3 |

Primary Examiner—Bruce C. Anderson
Attorney, Agent, or Firm—Gerald M. Fisher

[57] ABSTRACT

An integrated circuit manufacturing process for substantially eliminating negative electrostatic charge on a wafer surface after resist processing, comprising contacting the wafer with a dilute electrolyte solution having positive ions, restores the fidelity of CD's as measured by low-voltage SEM'S.

15 Claims, 4 Drawing Sheets

RESTORATION OF CD FIDELITY BY DISSIPATING ELECTROSTATIC CHARGE

FIELD OF THE INVENTION

This invention pertains to integrated circuit manufacturing processes, and in particular to a method of increasing the accuracy of critical dimension measurement.

BACKGROUND OF THE INVENTION

As integrated circuits become smaller and faster, the critical dimensions (CD's) of the devices and interconnections also must decrease. As these CD's get closer to the resolution limits of optical lithography and microscopy measurement techniques, great care must be taken to eliminate all possible sources of measurement error in order to obtain accurate and reproducible critical dimensions. One nearly universally used measurement technique is Scanning Electron Microscopy (SEM), which utilizes highly focused energetic beams of electrons impinging on the sample and measures the yield of secondary emitted electrons. SEM is the most widely used tool for VLSI measurement and morphology analysis, due to its high resolution of approx. 10–30 Angstroms, and relative ease of use.

FIG. 1 depicts an SEM system, showing the electron source and the acceleration, focusing, and detection electronics. FIG. 2 shows a typical electron emission energy spectrum resulting from the incident electron beam of an SEM. The highest energy peak results from the backscattered electrons, which have energies close to that of the incident beam, and which have undergone only elastic collisions with the target atoms. Peaks 20 seen at intermediate energies are the Auger electrons emitted due to relaxation of electrons between atomic energy levels. The lowest energy emitted electrons 22, produced by inelastic collisions between the primary beam and the inner shell electrons of the sample, are known as the secondary electrons and are generally the most useful for morphology studies in VLSI. This is due in part to the extremely short escape depth of secondary electrons, which yields high surface sensitivity. In addition, since the incident electron beam undergoes beam broadening due to multiple collisions as it penetrates into the sample, the backscattered electrons originating from deeper into the sample reflect this broadening with degraded point-to-point resolution. The lower energy secondary electrons which escape the sample originate from the surface region above the penetration depth where beam broadening becomes influential, and therefore yield higher point-to-point resolution than evidenced by backscattered electrons.

The detected electron current, typically chosen to be the secondary electron current as described above, is used to intensity modulate the z-axis of a CRT. An image of the sample surface is produced by synchronously raster scanning the CRT screen and the electron beam of the SEM.

The contrast of the image depends on variations in the electron flux arriving at the detector, and is related to the yield of emitted electrons per incident electron. The yield is dependent on both the work function of the material and the surface curvature. These factors allow the SEM to distinguish between materials such as metal, oxide, and silicon, and also to distinguish surfaces which differ in slope. Thus, Critical Dimensions (CD's) of patterned and/or etched lines and gaps can be measured.

Two factors affecting the accuracy of SEM measurements are resolution and charging effects. The resolution of the SEM depends on the type of sample under inspection and on the incident beam diameter or "spot size". The high voltages of the electron beam required to produce small scanning spot sizes were historically one of the sources for charging of the surface when examining insulating surfaces. When incident beam energies exceeded the secondary electron crossover point, i.e., when the incident beam penetration depth was high enough that the number of emitted secondary electrons was less than the number of incident electrons, the surface in the region of the scanning beam would acquire excess negative charge. This would cause the incident beam trajectory to be disturbed, and would therefore degrade the image. Grounding schemes such as coating the surface with gold and attaching a ground wire to the coating were used to reduce charging effects. These methods prohibited further processing following inspection of wafers. More recent SEM machines have eliminated high energy accelerating voltages, thus eliminating that source of charging. High voltage SEM's with gold coated samples are still used to verify CD's as measured in low-voltage SEM's.

However, semiconductor wafers can also acquire appreciable electrostatic charge during processing steps such as photoresist spin and expose. For example, it has been experimentally found that the charge on the resist layer after resist processing at the contact level is negative and can reach a magnitude of up to several hundred volts. This accumulated electrostatic charge can create severe undesirable effects in metrology, as well as to the devices themselves. For example, due to deflection of the incident e-beam during SEM linewidth/image inspection, the image focus is degraded. The negative surface charge also acts to accelerate emitted electrons away from the sample surface, thereby changing the time-of-flight to the detector and affecting the magnification. This has caused pitch measurement errors of as much as 10% for a 1.8 micron pitch.

Additionally, accumulated electrostatic charge on the wafer can adversely affect product yield by attracting airborne contaminant particles to the surface.

A non-destructive method of substantially eliminating accumulated electrostatic charge before SEM measurements or inspection, and which would permit continued processing of the inspected wafers, would restore the fidelity of CD measurement and reduce the undesirable effects of charging.

SUMMARY OF THE INVENTION

It is therefore an object of this invention to provide a semiconductor manufacturing method for substantially eliminating electrostatic charge from the surface of a silicon wafer during processing.

It is a further object of this invention to provide a method for substantially eliminating electrostatic charge which improves accuracy of subsequent SEM CD measurements and inspections.

It is a further object of this invention to provide a method for substantially eliminating electrostatic charge which permits the wafer to continue with processing after SEM measurements and/or inspections are completed.

DETAILED DESCRIPTION OF THE INVENTION

Figure 1:
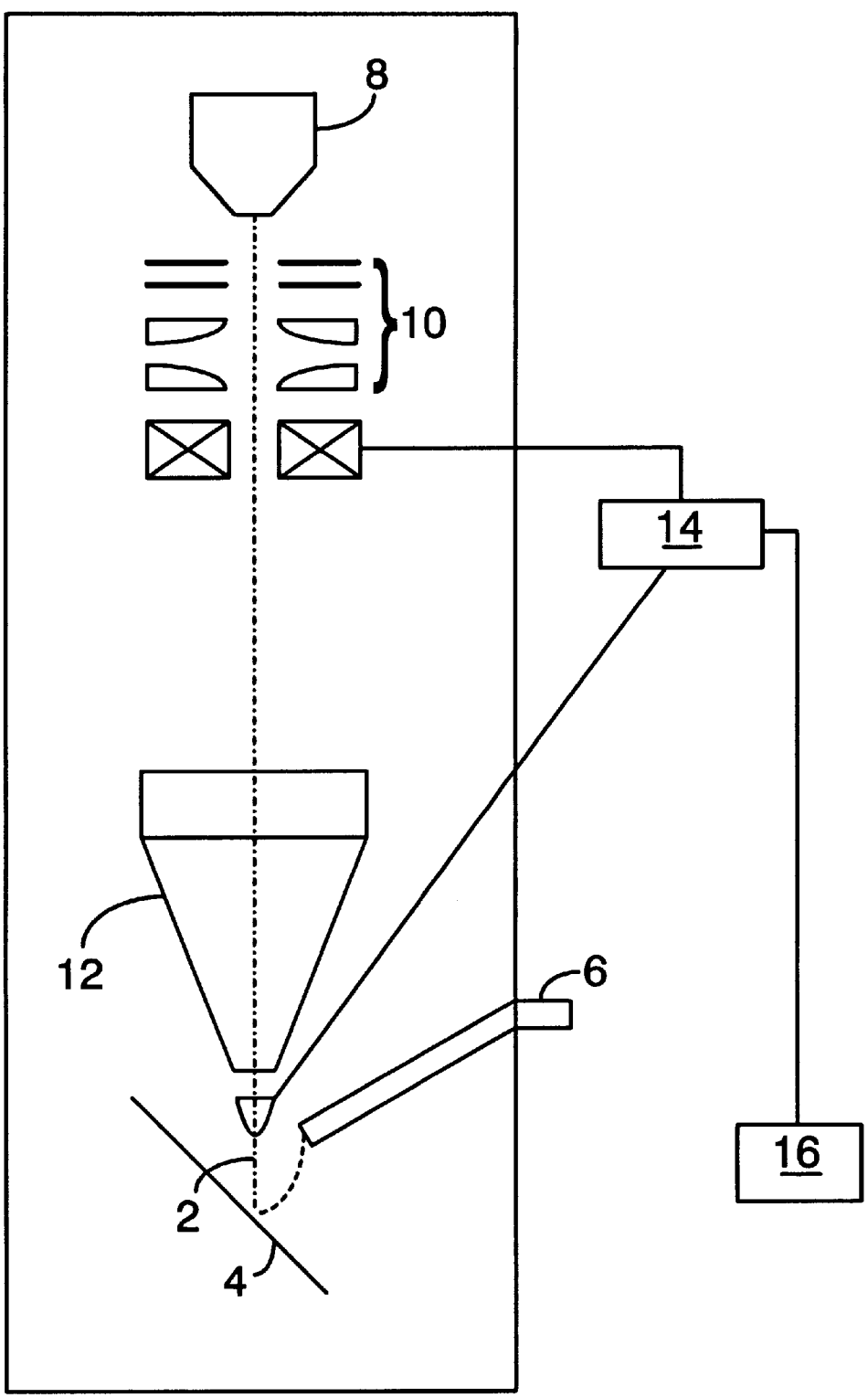
FIG. 1 is a schematic drawing of an SEM system.

FIG. 1 is a schematic diagram of an SEM system, showing incident electron beam 2 impinging on sample 4. The secondary electrons are collected and detected at detector 6. Electron beam source 8, accelerating and focusing electrodes 10, lens apparatus 12, scan control 14, and monitor 16 are also shown.

Figure 2:
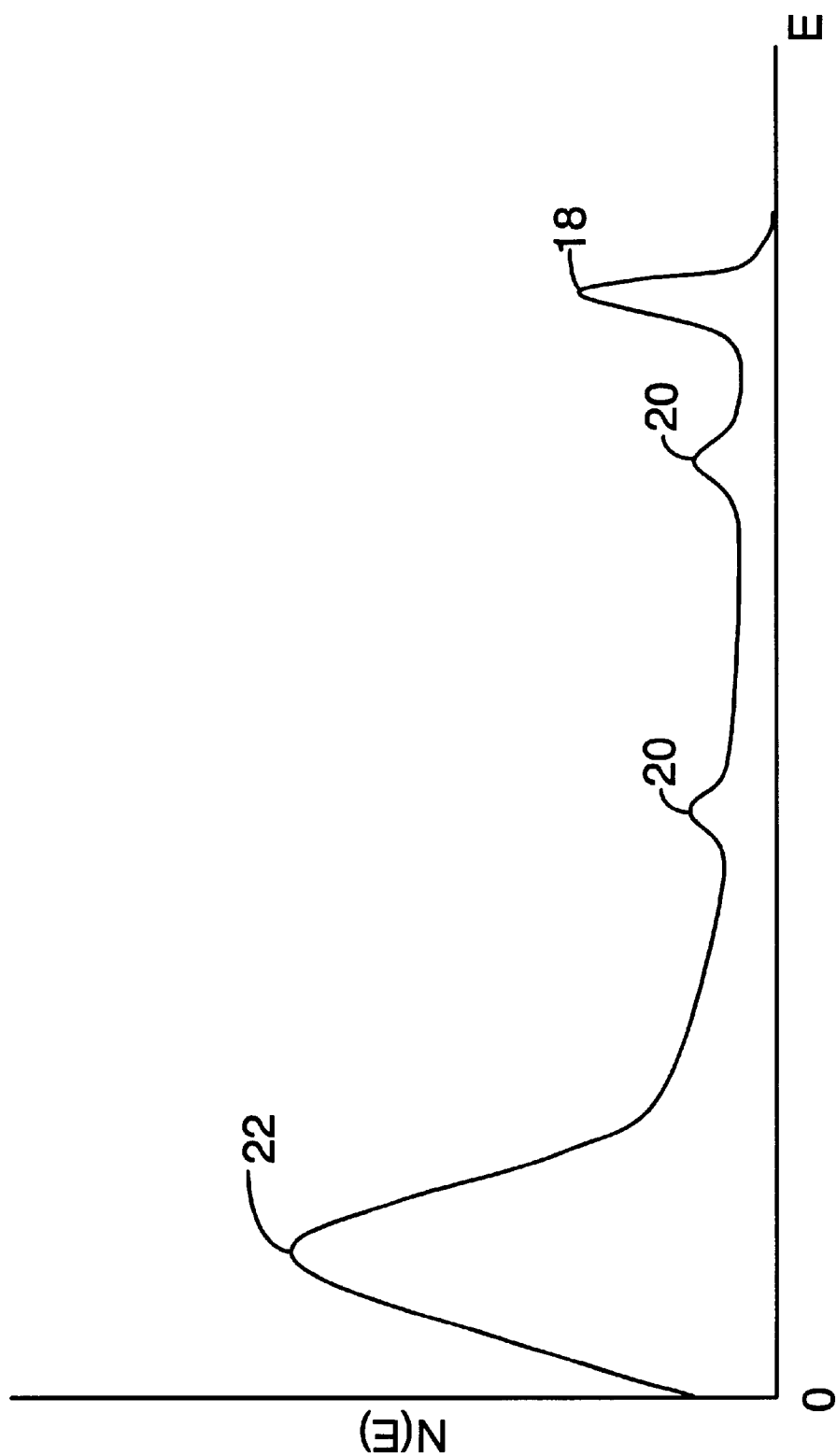
FIG. 2 is a representative spectrum of electrons emitted due to an impinging electron beam from an SEM.

FIG. 2 shows a representative spectrum of emitted electrons, including backscattering peak 18 at near the incident beam energy, Auger peaks 20, and secondary electron emission peak 22 at lower energy. In general, secondary electrons 22 are those detected by the SEM and employed for morphology analysis.

Figure 3A:
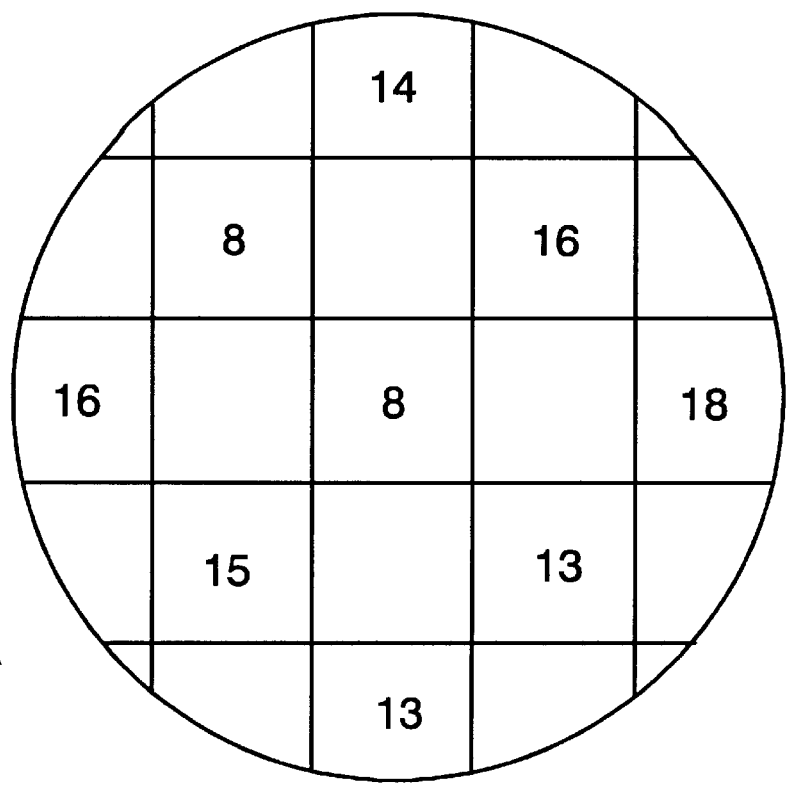
FIG. 3a is a wafer map showing electrostatic charge before resist processing.
Figure 3B:
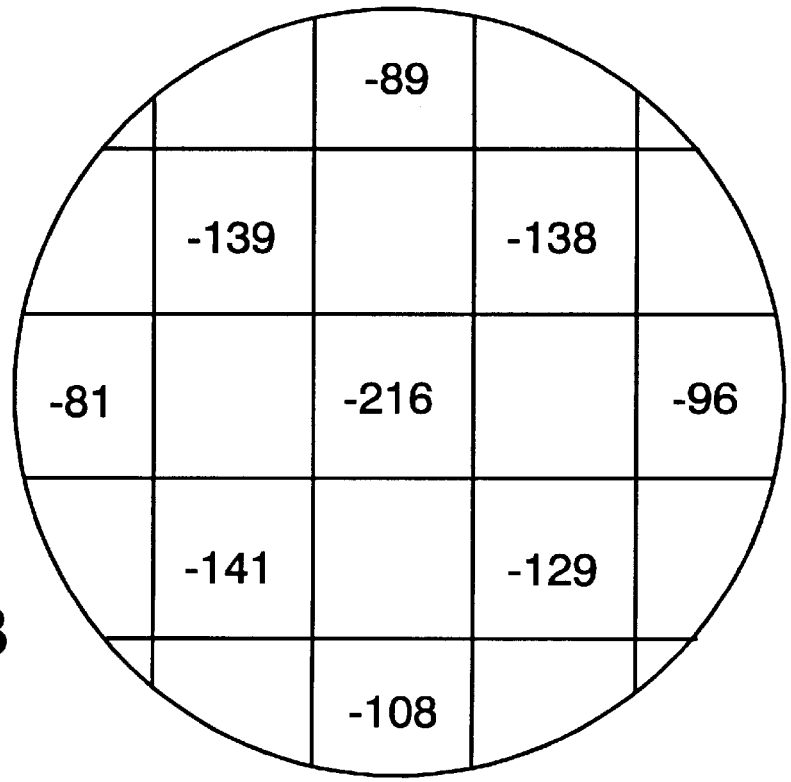
FIG. 3b is a wafer map showing electrostatic charge after resist processing.

FIG. 3a and FIG. 3b illustrates the accumulation, during second contact mask resist processing, of electrostatic charge on a first product wafer having semiconductor devices and metal thereon, with the top layer being a thick interlevel dielectric. FIG. 3a shows a wafer map of electrostatic charge measured by electrostatic voltmeter or fieldmeter, before resist is spun onto the dielectric layer. Electrostatic charge is under 20 volts. In contrast, FIG. 3b shows an electrostatic charge map of the same wafer after resist coating, expose, and develop steps. Electrostatic charge is as great as −216 volts near the wafer center for the wafer shown, and has been seen to exceed −1000 volts at the wafer center for other sample wafers. Electrostatic charge is in the −80 to −140 volt range near the wafer edge.

In these experiments the photoresists used include Shipley SPR511, SPR955, Apex E and Sumitomo PF132, all of which are polar compounds. It is believed that the electromechanical effect of spinning on the resist increases the polarization of the polar resist material. The layers of resist tend to self-align and therefore a charge separation occurs, with the negative charge tending to accumulate at the top resist surface. It is believed that the charge gradient across the wafer is due to the uneven distribution of the developer caused by centrifugal force.

Figure 4A:
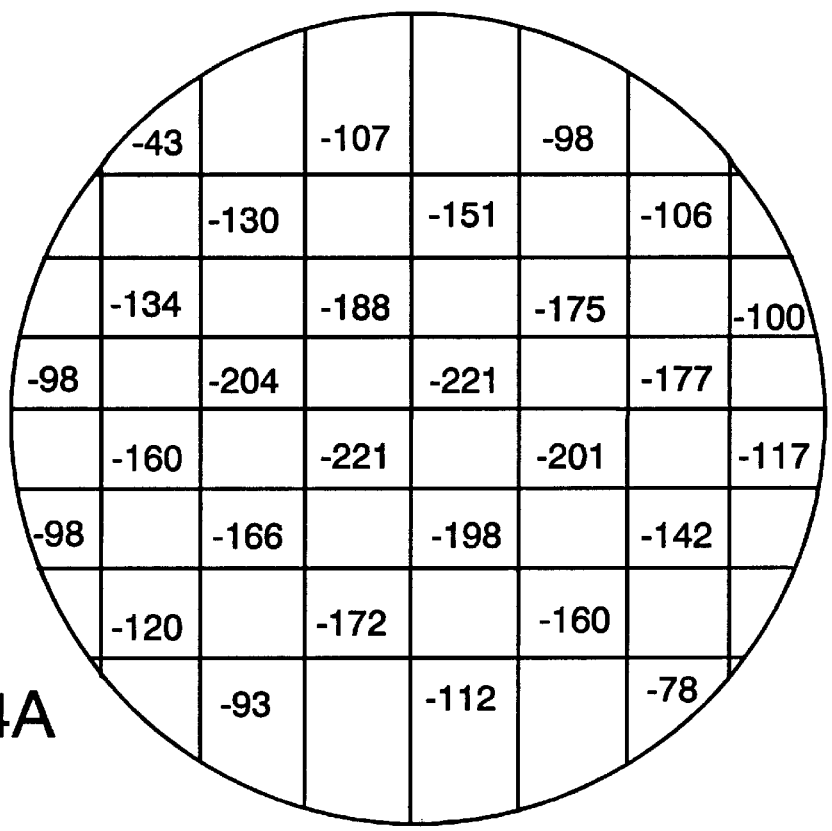
FIG. 4a is a wafer map showing electrostatic charge after resist processing and before the inventive weak acid dip.

According to our invention, before measuring CD's in an SEM, the accumulated negative electrostatic surface charge is substantially eliminated by rinsing or dipping the wafer in a dilute electrolyte solution of $10^{-2}$ to $10^{-5}$ parts HCl in distilled water for 5–10 seconds, followed by DI water and isopropyl alcohol rinse, and drying in nitrogen. FIG. 4 shows a wafer map of electrostatic charge before and after the inventive treatment for a second sample wafer after second contact mask resist spin, expose, and develop. FIG. 4a shows the electrostatic charge before the HCl dip. Charge is as high as −221 volts at the wafer center. As a result, the measured pitch on this wafer according to the SEM photographs was 1.62 microns, 10% lower than the actual value of 1.800 microns as determined by other means.

Figure 4B:
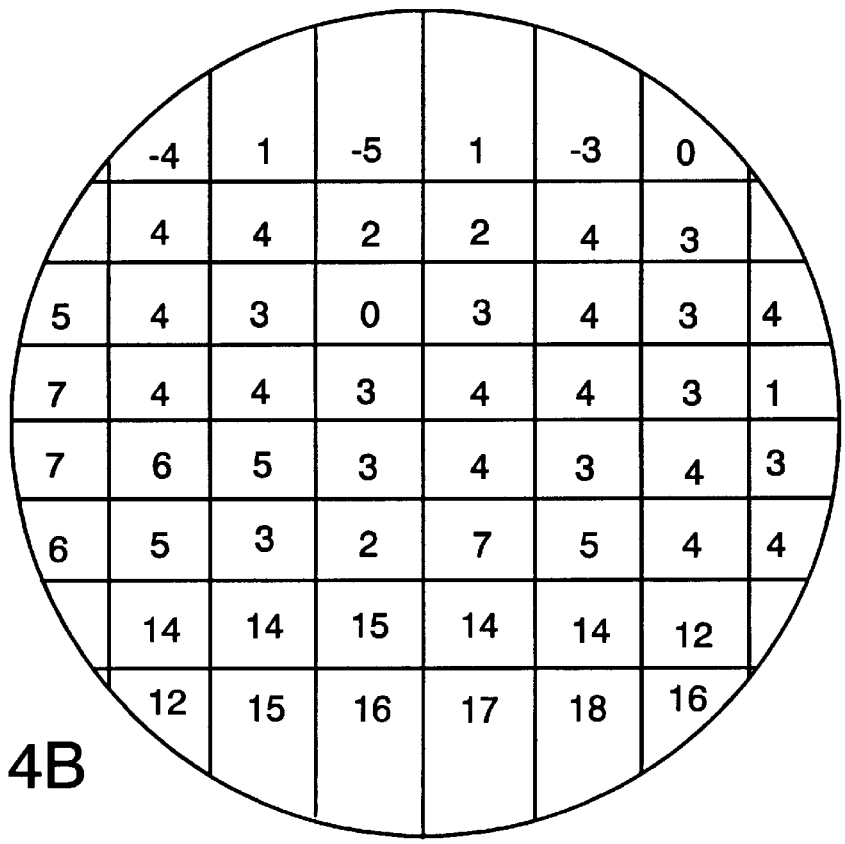
FIG. 4b is a wafer map showing electrostatic charge after resist processing and after the inventive weak acid dip.

As shown in FIG. 4b, the electrostatic charge is reduced to between −5 and +18 volts across the wafer after treatment with $10^{-4}$ parts Hcl as described above. SEM photographs after treatment show a clearer image, and a measured pitch of 1.775 microns, within 1.5% of the actual value of 1.800 microns.

It is believed that the weak acid provides positive hydrogen ions which neutralize the negative electrostatic charge accumulated at the surface. It is expected that any Bronsted acid, i.e., proton donator, will be an effective neutralizer. Examples of other acids which might be used without introducing undesirable contaminant ions include carbonic acid ($H_2CO_3$), phosphoric acid ($H_3PO_4$), Hbr, HI and $HNO_3$. The acceptable concentration range is defined as the range which provides sufficient positive ions to neutralize the negative surface charge, yet does not substantially cause etching of the surface layer. In the case of a dilute aqueous solution of HCl, this range has been determined to be $10^{-2}$ to $10^{-5}$ parts HCl.

Our invention provides an extremely simple and effective solution to a widespread and often serious measurement problem. It can easily be incorporated into any existing process flow at little cost and without damaging the inspected wafers. In addition, the substantial elimination of electrostatic charge can reduce the number of airborne contaminant particles which are attracted to the wafer surface, and can therefore increase product yield.

Although the process as described utilizes weak Bronsted acids such as HCl, it is not limited to this embodiment. For example, other ionic solutions which can provide positive ionic species to neutralize the negative surface charge might also be used without altering the inventive concept. The scope of the invention should be construed in light of the claims.

With this in mind, we claim:

1. An integrated circuit manufacturing process for accurately measuring Critical Dimensions (CD's) of patterned photoresist features on the surface of a semiconductor wafer, said photoresist having a top surface, said top surface having an accumulated negative electrostatic charge thereon, comprising:

exposing said semiconductor wafer surface to positive ions, said negative electrostatic charge on said semiconductor wafer surface being substantially neutralized by said positive ions; and measuring said CD's in a Scanning Electron Microscope (SEM);

whereby CD's of resist features on said wafer surface, as measured by saud SEM, are substantially equal to actual CD's.

2. The process of claim 1, where said step of exposing said semiconductor wafer surface to positive ions comprises:

contacting said photoresist with an electrolyte solution containing said positive ions such that said positive ions bond ionically onto said top surface of said photoresist.

3. The process of claim 2, wherein said electrolyte solution is a dilute aqueous solution.

4. The process of claim 3, wherein said dilute aqueous solution contains a Bronsted acid.

5. The process of claim 4, wherein said dilute aqueous solution is selected from the group consisting of HCl, $H_2CO_3$, $H_3PO_4$, Hbr, HI and $HNO_3$.

6. The process of claim 5, wherein said dilute aqueous solution comprises HCl.

7. The process of claim 5, wherein said dilute aqueous solution is in the concentration range between $10^{-2}$ and $10^{-5}$ parts in distilled water.

8. The process of claim 2, wherein said step of contacting includes immersing said photoresist in said electrolyte solution.

9. The process of claim 8, further comprising the steps of:
   rinsing said wafer in DI water, and
   rinsing said wafer in isopropyl alcohol.

10. A process for discharging a negative charge on an insulating surface of a silicon wafer, comprising the steps of:
    providing a silicon wafer having an insulating surface thereon and having an accumulated negative electrostatic charge on said insulating surface;

exposing said insulating surface to positive ions, said negative electrostatic charge on said insulating surface being substantially neutralized by said positive ions;

wherein said step of exposing said insulating surface to positive ions comprises:

contacting said insulating surface with an electrolyte solution containing said positive ions such that said positive ions bond ionically onto said insulating surface;

said electrolyte solution being a dilute aqueous solution containing a Bronsted acid.

11. The process of claim 10, wherein said dilute aqueous solution is selected from the group consisting of HCl, $H_2CO_3$, $H_3PO_4$, Hbr, HI and $HNO_3$.

12. The process of claim 11, wherein said dilute aqueous solution comprises HCl.

13. The process of claim 11, wherein said dilute aqueous solution is in the concentration range between $10^{-2}$ and $10^{-5}$ parts in distilled water.

14. The process of claim 10, wherein said step of contacting includes immersing said insulating surface in said electrolyte solution.

15. The process of claim 14, further comprising the steps of:

rinsing said wafer in DI water, and rinsing said wafer in isopropyl alcohol.

* * * * *